US007633618B2

(12) United States Patent  (10) Patent No.: US 7,633,618 B2
Monshouwer  (45) Date of Patent: Dec. 15, 2009

(54) METHOD AND APPARATUS FOR MEASURING THE RELATIVE POSITION OF A FIRST AND A SECOND ALIGNMENT MARK

(75) Inventor: Rene Monshouwer, Leiden (NL)

(73) Assignee: ASML Netherlands B.V., Veldhoven (NL)

(*) Notice: Subject to any disclaimer, the term of this patent is extended or adjusted under 35 U.S.C. 154(b) by 890 days.

(21) Appl. No.: 10/979,817

(22) Filed: Nov. 3, 2004

(65) Prior Publication Data

US 2005/0123844 A1   Jun. 9, 2005

(30) Foreign Application Priority Data

Nov. 4, 2003   (EP) .................................. 03078479

(51) Int. Cl.
*G01B 11/00*   (2006.01)
(52) U.S. Cl. ....................................... 356/401; 257/797
(58) Field of Classification Search ................. 356/618, 356/605, 508, 395, 399–401; 438/401; 257/797
See application file for complete search history.

(56) References Cited

U.S. PATENT DOCUMENTS 6,766,211 B1   7/2004   Ausschnitt

2002/0080364 A1   6/2002   Monshouwer et al.
2004/0246482 A1*  12/2004  Sezginer et al. ............. 356/401

FOREIGN PATENT DOCUMENTS

WO        WO97/45773        12/1997

OTHER PUBLICATIONS

Zaidi et al., "Moiré interferometric alignment and overlay techniques," Proceedings of the SPIE 2196:371-382 (1994).

* cited by examiner

*Primary Examiner*—Tarifur Chowdhury
*Assistant Examiner*—Michael Lapage
(74) *Attorney, Agent, or Firm*—Pillsbury Winthrop Shaw Pittman LLP

(57) ABSTRACT

The invention relates to a method for measuring the relative position of a first and a second alignment mark on a substrate. The first alignment mark comprises a periodic structure having a first portion with a first periodicity ($PE_1$) and an adjacent second portion with a second periodicity ($PE_2$). The second alignment mark (11) comprises a periodic structure having a first portion with the second periodicity ($PE_2$) and an adjacent second portion with the first periodicity ($PE_1$). The first and second alignment marks are arranged such that the first portions are substantially located one over the other and the second portions are substantially located one over the other. The method further comprises generating a Moiré pattern from the alignment marks and determining the relative positions of the first and second alignment marks based on the periodicity of the Moiré pattern.

17 Claims, 3 Drawing Sheets

Prior Art

METHOD AND APPARATUS FOR MEASURING THE RELATIVE POSITION OF A FIRST AND A SECOND ALIGNMENT MARK

CROSS-REFERENCE TO RELATED APPLICATIONS

This Application claims priority from European Patent Application No. 03078479.7 filed Nov. 4, 2003, which is incorporated herein by reference in its entirety.

FIELD OF THE INVENTION

The present invention relates to a method for measuring a relative position of a first alignment mark and a second alignment mark on a substrate, wherein the alignment marks are placed in a first direction that is substantially along the surface of the substrate. The present invention further relates to a device manufacturing method. A substrate is provided with at least two alignment marks according to the invention and an apparatus for applying the method according to the invention.

The present invention further relates to a lithographic projection apparatus that includes a radiation system for supplying a projection beam of radiation, a support structure for supporting patterning means, the patterning means serving to pattern the projection beam according to a desired pattern, a substrate table for holding a substrate, and a projection system for projecting the patterned beam onto a target portion of the substrate.

BACKGROUND

The term "patterning means" as here employed should be broadly interpreted as referring to structure that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The matrix addressing can be performed using suitable electronic components. In both of the situations described above, the patterning means can comprise one or more programmable mirror arrays. More information on mirror arrays as here referred to can be gleaned, for example, from United States patents U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable.

A programmable LCD array. An example of such a construction is given in United States patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning means as here above set forth.

Lithographic projection apparatus can be used, for example, in the manufacture of integrated circuits (ICs). In such a case, the patterning means may generate a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one exposure; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g., in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g., with a wavelength of 365, 248, 193, 157 or 126 nm) and extreme ultra-violet (EUV) radiation (e.g., having a wavelength in the range 5-20 nm), as well as particle beams, such as ion beams or electron beams.

A lithographic projection apparatus is used to successively image a number of masks having different mask patterns at the same position on a substrate. The substrate must undergo a plurality of desired physical and chemical changes between the successive projections of the different mask patterns. To this end, the substrate must be removed from the apparatus after it has been exposed to a mask pattern. After it has undergone the desired processing steps, the substrate must again be placed at the same position in the lithographic projection apparatus so as to expose it with a second mask pattern, and so forth. It must be ensured that the second and subsequent mask patterns are positioned accurately with respect to device structures already formed in the substrate during the exposure to the preceding mask pattern. Errors in the relative positioning of subsequent layers with respect to each other are usually referred to as overlay errors. In order to reduce these overlay errors, the lithographic projection apparatus is provided with an alignment system.

Different alignment systems are known from the prior art, for instance as described in WO 02/052350. This document describes a method of measuring alignment of a substrate using an alignment mark provided in a processed layer of a substrate and an additional alignment mark provided in a resist layer of the substrate. For ease of reference the alignment mark in the processed layer will be referred to as the substrate alignment mark, and the alignment mark in the resist layer will be referred to as the resist alignment mark. The resist alignment mark overlaps the substrate alignment mark on the substrate. The period of the substrate alignment mark and the period of the resist alignment mark are slightly different, so that, upon illumination by an alignment beam an interference pattern, or Moiré pattern, is generated having a period which is substantially equal to the period of the measurement mark. The position of the interference pattern is measured with respect to a reference alignment mark provided on the substrate.

The method as described here can be used in different manners. Usually the resist alignment mark is projected at the same time as a circuit pattern. Then, the substrate is processed in order to make the resist alignment mark (and the circuit pattern) visible. After that, the overlay error is determined by means of the Moiré pattern and the reference alignment mark as described above. If the overlay error is too big, the resist layer is removed and the substrate is subjected to a new exposure.

Alternatively the resist alignment mark may be projected without the circuit pattern. The resist alignment mark may be visible as a so called 'latent image' (i.e., before a post treatment is applied). The overlay error can then be determined. On the basis of the determined overlay error, the position of the substrate can be adjusted, and then the circuit pattern can be projected onto the substrate with the overlay error removed.

An overlay error in the relative positioning of the substrate alignment mark and the resist alignment mark results in a shift of the Moiré pattern. But, as will be understood by a person skilled in the art, the shift of the Moiré pattern is larger than the actual overlay error. Thus, a small overlay error results in a larger shift of the Moiré pattern. Smaller positional errors can thus be measured than would be possible using a conventional alignment mark. However, the alignment system described above, has the disadvantage that it requires the presence of a reference mark.

SUMMARY OF THE INVENTION

Therefore, it is an object of the present invention to provide a method for measuring the relative position of a first alignment mark and a second alignment mark oriented in a first direction, without the need of a reference alignment mark. This object is achieved according to a method as specified above, characterized in that the first alignment mark comprises a periodic structure oriented substantially in the first direction and having a first portion with a first periodicity and an adjacent second portion with a second periodicity.

The second alignment mark comprises a periodic structure oriented substantially in the first direction having a first portion with the second periodicity and an adjacent second portion with the first periodicity.

The first and second alignment marks are arranged such that the first portion of the first and second alignment marks are substantially located one over the other, and the second portion of the first and second alignment marks are substantially located one over the other.

The method includes directing an alignment beam to the first and second alignment marks, measuring a Moiré pattern generated by the first and second alignment marks, and determining the relative positions of the first and second alignment marks based on the measured Moiré pattern.

This method makes it possible to measure the relative position of two alignment marks without the need of a reference alignment mark.

According to an embodiment of the invention, the portions have a length of substantially $PE_b/2$, where $PE_b$ is given by: $1/PE_b = 1/PE_1 - 1/PE_2$, where $PE_1$ is the first periodicity and $PE_2$ is the second periodicity.

According to an embodiment of the invention, the first and second alignment marks are provided in different layers on the substrate. This method can advantageously be used in IC technology, where the alignment of different patterned layers on a substrate needs to be done very accurately.

According to an embodiment of the invention, the second alignment mark is a latent alignment mark. If the projection of the mark results in a latent mark, i.e., a mark that is visible without further post processing, such as a post-exposure-bake, the alignment can be done in the exposure unit of the lithographic projection apparatus. In that case the alignment can be checked without further processing of the substrate. This also makes it possible to first project the second alignment mark, check the alignment and only then project the patterned beam.

According to an embodiment of the invention, the second alignment mark is a developed alignment mark. The second alignment mark is developed after imaging the second alignment mark. If the projection of the mark doesn't result in a latent mark, further processing is required in order to check the alignment. However, the method can also advantageously be used in those cases. The second alignment mark is then projected together with the patterned beam. Only if, after further processing, the alignment appears to be not sufficient, the resist layer is simply removed and the substrate is prepared for a next exposure.

According to an embodiment of the invention, measuring the Moiré pattern comprises determining the periodicity of the Moiré pattern by making a spatial map showing an intensity of the Moiré pattern. Making a spatial map of the intensity in this way can advantageously be done by using a CCD-camera adjacent to the substrate. The term adjacent is intended to mean that there is no substantial difference between the measured intensity spatial map and that which would be seen directly on top of the second alignment mark.

According to an embodiment of the invention, measuring the Moiré pattern comprises determining the intensity of the Moiré pattern at least at one position.

According to an embodiment of the invention, the at least one position is adjacent to the second alignment mark and corresponds to the phase transition from the first to a second portion within a layer.

According to an embodiment of the invention, measuring the shape of the Moiré pattern comprises determining the intensity of the Moiré pattern at least at one position, wherein the at least one position is adjacent to the second alignment mark and corresponds to the phase transition with an offset of $PE_b/4$.

According to an embodiment of the invention, measuring the Moiré pattern comprises determining the periodicity of the Moiré pattern by measuring the intensity of at least one diffraction line of a diffraction pattern generated from the first and second alignment marks.

According to an embodiment of the invention, the at least one diffraction line corresponds to the periodicity or half the periodicity of the Moiré pattern.

According to an embodiment of the invention, the first and the second periodicities are formed by a block function, comprising alternating first and second parts, and each of the first and second portions ends in the first direction with a length of one or three quarters of the respective first or second periodicities.

A block function can be formed by a lower part and an adjacent upper part. Thus, with a 50% duty cycle, a portion that ends with a quarter of such a block function ends with half a lower or half an upper part. Such a transition results in a Moiré pattern that has a smooth transition between the different portions. However, the general idea of the invention also applies to other phase transitions.

According to a further aspect, the invention relates to a device manufacturing method that provides a substrate that is at least partially covered by a layer of radiation-sensitive material. A projection beam of radiation is generated using a radiation system, and a cross-section of the projection beam of radiation is patterned using patterning means. The patterned beam of radiation may be projected onto a target portion of the layer of radiation-sensitive material. A method is provided for measuring a relative position of a first and a second alignment mark on the substrate as defined above.

According to a further aspect, the invention relates to a substrate provided with at least two alignment marks, wherein the first alignment mark comprises a periodic structure oriented substantially in the first direction having a first portion with a first periodicity and an adjacent second portion with a second periodicity.

The second alignment mark comprises a periodic structure positioned substantially in the first direction having a first portion with the second periodicity and an adjacent second portion with the first periodicity.

The first and second alignment marks are arranged such that the first portion of the first and second alignment marks are substantially located one over the other, and the second portion of the first and second alignment marks are substantially located one over the other.

According to a further aspect of the invention, the invention relates to an alignment apparatus for determining a relative position in a first direction of a first and a second alignment mark, the alignment apparatus comprising a substrate holding device for holding a substrate, which substrate is provided with the first and second alignment marks and can be provided in such a way that, in use, the first and second alignment marks are exposed to an alignment beam, to generate a Moiré pattern.

The apparatus is further arranged to perform a method for measuring a relative position of a first and a second alignment mark oriented on a substrate in a first direction that is substantially along the surface of the substrate. The first alignment mark includes a periodic structure oriented substantially in the first direction having a first portion with a first periodicity and an adjacent second portion with a second periodicity. The second alignment mark includes a periodic structure oriented substantially in the first direction having a first portion with the second periodicity and an adjacent second portion with the first periodicity. The first and second alignment marks are arranged such that the first portion of the first and second alignment marks are substantially located one over the other, and the second portion of the first and second alignment marks are substantially located one over the other. The apparatus includes a beam generator for directing an alignment beam to the first and second alignment marks, a light detecting element for detecting a Moiré pattern generated by the first and second alignment marks, a unit for determining the periodicity of the Moiré pattern, and a unit for determining the relative positions of the first and second alignment marks that are oriented in substantially the first direction, based on the determined periodicity of the Moiré pattern.

According to a further aspect, the invention relates to a lithographic projection apparatus that includes a radiation system for providing a projection beam of radiation, a support structure for supporting a patterning means, the patterning means serving to pattern the projection beam according to a desired pattern, a substrate table for holding a substrate; and a projection system for projecting the patterned beam onto a target portion of the substrate.

The lithographic projection apparatus further includes an alignment apparatus according to the invention.

According to a further embodiment, the invention relates to a lithographic projection apparatus according to the invention, arranged to project an image of a mask on the substrate, and to determine a first relative position of the first and second alignment marks to determine an error in a second relative position between the mask and the substrate.

Preferably the first alignment mark is a substrate alignment mark. Preferably the second alignment mark is a resist alignment mark.

BRIEF DESCRIPTION OF DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
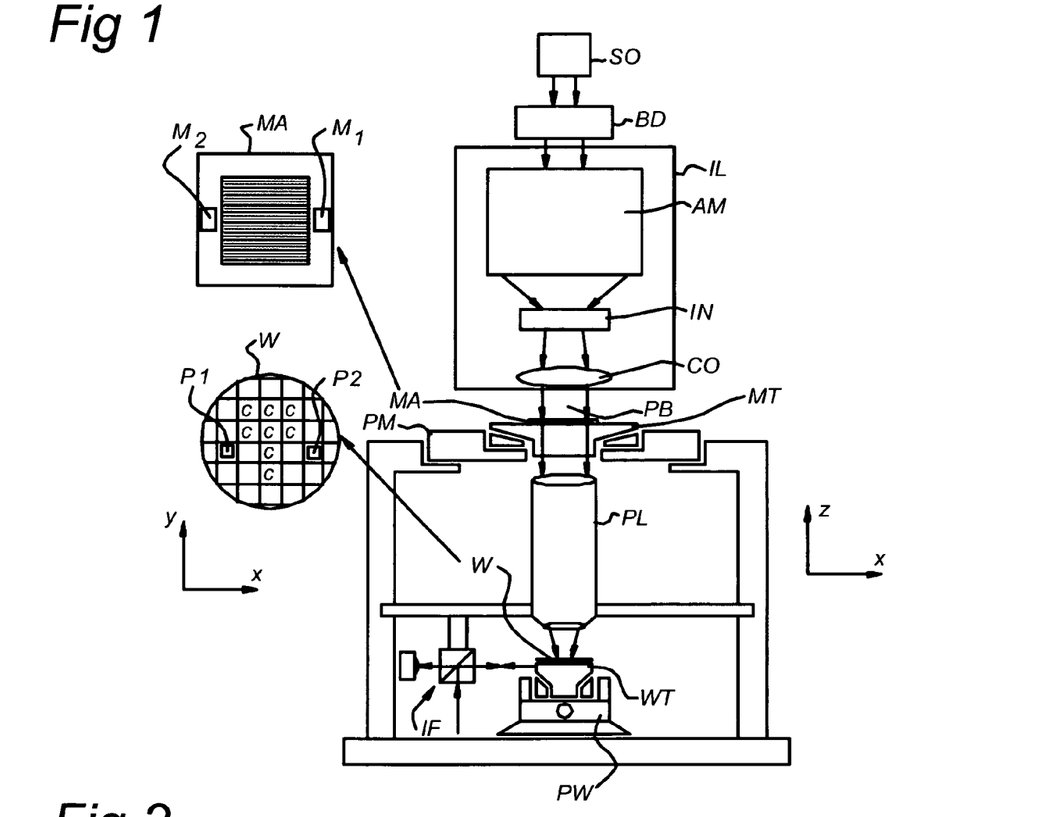
FIG. 1 depicts a lithographic projection apparatus according to an embodiment of the invention.

FIG. 1 schematically depicts a lithographic apparatus according to a particular embodiment of the invention. The apparatus comprises:

- an illumination system (illuminator) IL for providing a projection beam PB of radiation (e.g., UV radiation or EUV radiation).
- a first support structure (e.g., a mask table) MT for supporting patterning means (e.g., a mask) MA that is coupled to first positioning means PM for accurately positioning the patterning means with respect to item PL;
- a substrate table (e.g., a wafer table) WT for holding a substrate (e.g., a resist-coated wafer) W and coupled to second positioning means PW for accurately positioning the substrate with respect to item PL; and a projection system (e.g., a refractive projection lens) PL for imaging a pattern imparted to the projection beam PB by patterning means MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be integral part of the apparatus, for examples when the source is a mercury lamp. The source SO and the illuminator IL, together with the beam delivery system BD if required, may be referred to as a radiation system.

The illuminator IL may comprise adjusting mechanisms AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning means PW and position sensor IF (e.g., an interferometric device), the substrate table WT can be moved accurately, e.g., so as to position different target portions C in the path of the beam PB. Similarly, the first positioning means PM and another position sensor (which is not explicitly depicted in FIG. 1) can be used to accurately position the mask MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning means PM and PW. However, in the case of a stepper (as opposed to a scanner) the mask table MT may be coupled to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one action (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning means, and the substrate table WT is moved or scanned while a pattern imparted to the projection beam is projected onto a target portion C. In this mode, generally a pulsed radiation source is employed and the programmable patterning means is updated as required after each movement of the substrate table WT or in between successive radiation pulses during a scan. This mode of operation can be readily applied to maskless lithography that utilizes programmable patterning means, such as a programmable mirror array of a type as referred to above.

Combinations and/or variations on the above described modes of use or entirely different modes of use may also be employed.

Figure 2:
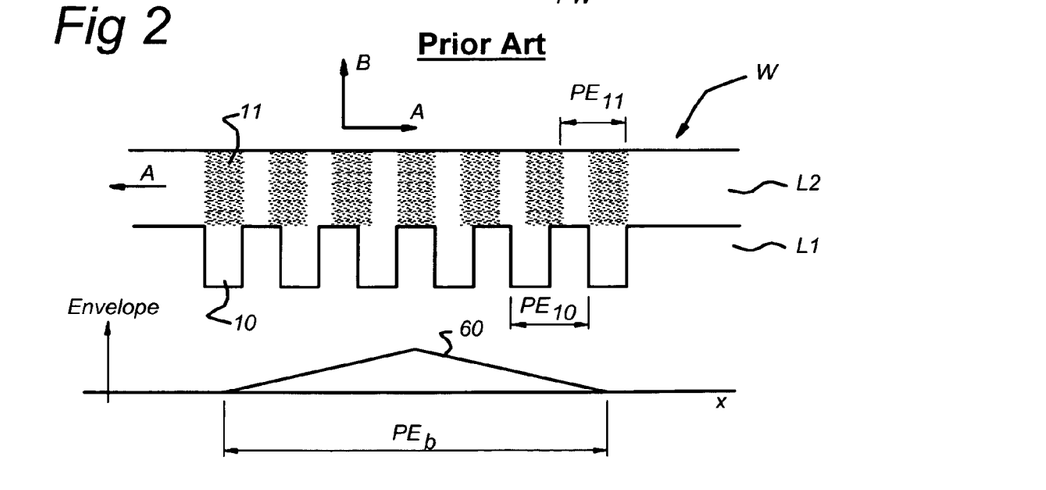
FIG. 2 schematically depicts alignment marks according to the prior art.

The upper part of FIG. 2 shows a part of the alignment marks according to the prior art in a cross-section and on a very large scale. These alignment marks are arranged on a surface of a substrate W and are constituted by periodic structures each with a given periodicity known as phase structures, for example, phase gratings. These phase gratings each extend in a first given direction indicated by arrow A. The first given direction indicated by arrow A is substantially parallel to the surface plane of the substrate. Further, these phase gratings are displaced relative to each other in a second direction substantially perpendicular to the first given direction, indicated by arrow B, substantially perpendicular to the surface plane of the substrate W.

FIG. 2 shows a prior art substrate alignment mark 10 with a grating period $PE_{10}$ and a resist alignment mark 11 with a grating period $PE_{11}$. The grating period $PE_{10}$ of the substrate alignment mark 10, provided in a first layer L1 of the substrate W, is larger than the period $PE_{11}$ of the resist alignment mark 11 (a smaller period may be used), provided in a second layer L2 of the substrate W. When illuminating these alignment marks 10, 11 by an alignment-measuring beam, the marks cause the reflected beam to interfere so that an interference phase pattern, or phase image is generated. This phase pattern, which may also be called a Moiré pattern or Moiré grating, has a length $PE_b$ which is given by:

$$1/PE_b = 1/PE_{10} - 1/PE_{11}$$

It will be understood from this formula that if the substrate alignment mark 10 and resist alignment mark 11 overlap over a substantially larger distance than $PE_b$, then the Moiré pattern will begin to repeat ($PE_b$ will form the Moiré period). $PE_b$ is larger than the periodicities of the substrate alignment mark $PE_{10}$ and the resist alignment mark $PE_{11}$. Therefore the substrate alignment mark 10 and the resist alignment mark 11, where they are referred to in combination will be termed the fine alignment marks.

The graph 60 in the lower part of FIG. 2 shows the envelope of phase depth variations of the phase pattern along the X direction, i.e., perpendicular to the grating strips of the substrate alignment mark 10 and the resist alignment mark 11. The phase variation or the position of the maxima and minima of the Moiré pattern is determined by the relative position of the alignment marks 10, 11. In order to measure this relative position or the relative shift in the X direction of the alignment marks 10, 11, the Moiré phase pattern is imaged on an on-axis or off-axis measuring grating, or measuring mark (not shown), arranged in front of a radiation-sensitive detector. If, for this imaging, an optical system is used which can resolve the coarse Moiré pattern with the period $PE_b$, but not the fine alignment marks with the periods $PE_{10}$ and $PE_{11}$, only the triangular-like variation of the phase pattern, i.e., the position of the Moiré pattern will be detected. The position of the Moiré pattern depends on the position of the substrate alignment mark 10 and the relative shift between the substrate alignment mark and the resist alignment mark 11. In order to determine the shift of the alignment marks relative to each other using the Moiré pattern, the position of the Moiré pattern with respect to the reference mark must be determined. A small relative shift of the fine alignment marks 10, 11 is translated into a considerably larger shift of the Moiré pattern, i.e., this shift is magnified. The magnification factor $M_f$ is given by:

$$M_f = \text{shift}_{Moiré}/\text{Shift}_{fine\ marks} = PE_{10}/(PE_{11} - PE_{10})$$

Because of the magnification, less interpolation of the detector signal is needed in the alignment signal processing, so that the measurement is more accurate. Due to the magnification, the measurement of the position of the Moiré pattern is not very critical. If an error $\Delta$ is made in the determination of the Moiré pattern position this will result in a much smaller error of $(1/M_f)\Delta$ in the determination of the fine marks. The magnification factor $M_f$ may be of the order of 10 or 20.

The alignment marks 10, 11 may be phase marks and/or amplitude marks. In the case of a phase mark, this mark is etched in a layer of the substrate. The resist alignment mark 11 is a phase mark, but can also be a mark that influences the intensity, a so called amplitude grating. The phase mark may be constituted by a mark in a developed resist layer. The phase depth of such a mark is determined by the difference in refractive index of the resist and that of the surrounding medium, usually air, and the thickness of the resist. Since this difference in refractive index is fairly large, there is a strong relationship between the resist thickness and, via the phase depth, the signal generated by the phase mark. The resist alignment mark 11 may also be a so-called latent mark, i.e., an image of a resist alignment mark in a resist that has not been developed. Such an image comprises first areas upon which projection beam radiation has been incident and second areas for which this is not the case. These first and second areas provide different optical path lengths for the alignment-determining beam passing through them. This difference is due to either chemical changes in the first areas, which changes cause a change in the refractive index in these areas, or to material shrinkage in these areas resulting in a height difference between the first and second areas. These effects are modest and, for the usual resist thickness, no oscillatory change of the alignment signal with resist thickness will occur. Using a latent resist alignment mark provides the advantage that the substrate with the resist layer does not need to be removed from the lithographic apparatus for development of the resist.

However, as already stated above, the method according to the prior art and described with reference to FIG. 2 requires the use of a reference mark. According to the invention, this reference mark is no longer required, since an overlay feature is provided on the substrate that provides information about the relative positioning of two alignment marks in different layers L1, L2 of the substrate W.

As already described above, if two periodic structures 10, 11 are positioned on top of each other, a Moiré pattern will be generated having a period $PE_b$, given by:

$$1/PE_b = 1/PE_{10} - 1/PE_{11}.$$

If $PE_{10}$ equals 1 µm and $PE_{11}$ equals (16/15) µm, the period of the Moiré pattern will equal 16 µm, being substantially larger than the periods of the alignment marks 10, 11.

Using the equation given above to determine a magnification factor $M_f$, it can be calculated that a shift of 1 nm in the periodic direction of one of the alignment marks with respect to the other alignment mark, will cause the Moiré pattern to shift 15 nm. The direction of the Moiré shift depends on the direction of the relative shift of the alignment marks. For instance, if the resist alignment mark 11 is shifted to the left, the Moiré pattern is also shifted to the left and vice versa. If however $PE_{11}$ were smaller than $PE_{10}$, a shift to the left of the resist alignment mark 11 would result in a Moiré shift to the right.

Figure 3A:
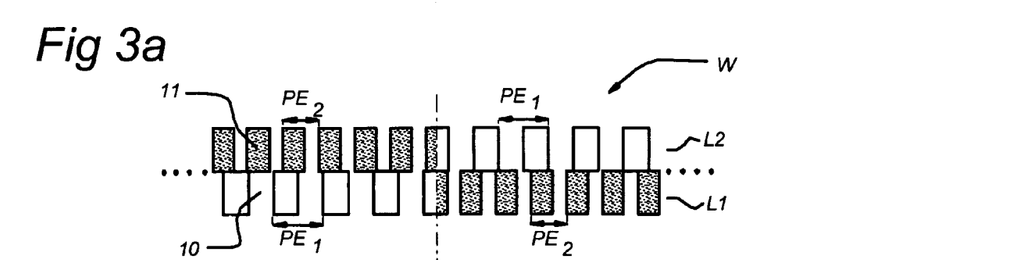
FIGS. 3a, 3b and 3c schematically depict alignment marks and a generated Moiré pattern according to an embodiment of the present invention.

According to the invention, two alignment marks 10, 11 are provided, each being divided in at least two portions, alternately provided with a periodic structure of $PE_1$ and $PE_2$, as is depicted FIG. 3a. The two alignment marks 10, 11 are each provided in a different layer L1, L2 on the substrate W and are positioned in such a way that portions in the upper layer L2 positioned above portions in the lower layer L1 have different periods relative to the portions below. Thus, the portions of the upper layer L2 that have a periodicity of $PE_1$ are substantially positioned above and aligned with the portions of the lower layer L1 that have a periodicity of $PE_2$, and vice versa.

The dots in FIG. 3a indicate that the pattern of the alignment marks 10, 11 as shown may be extended beyond the length of $PE_b/2$. This could either be with portions longer than $PE_b/2$ or by increasing the number of portions. In case the number of portions is increased, the distance between the portions within a layer should be equal for both layers. In principal it is possible to carry out the invention with two portions per alignment mark.

In an exemplary embodiment, the periodicity of the Moiré pattern (or equivalently the beat periodicity) is the inverse of the length of the Moiré pattern formed by two portions. However, it will be understood by a person skilled in the art, that the quality of the diffraction pattern and hence the quality of the obtained measurements, increases when more portions per layer are used.

Portions positioned on top of each other have different periods. These periods are preferably chosen close to each other, to generate a Moiré pattern with a relatively large period, satisfying:

$$1/PE_b = 1/PE_1 - 1/PE_2,$$

and creating a relatively large magnification factor $M_f$, for instance 15.

Every two portions positioned on top of each other will generate a Moiré pattern, having a period equal to $PE_b$, according to the equation described above. The length of each portion preferably equals $PE_2/2$, for reasons that will become apparent below. The Moiré pattern may, for instance, have a shape as shown in the upper part of FIG. 3b, having a periodicity of $PE_b$. The Moiré pattern on the left hand side of the vertical axis is generated by a first portion, while the Moiré pattern on the right hand side is generated from a second portion.

It will be understood by a person skilled in the art that the phase transition from a first to a second portion within a layer determines the exact shape of the obtained Moiré pattern. As can be seen in FIG. 3a, the portions are formed by a block function, having alternating first and second parts. E.g., in the right portion in layer L1 as indicated in FIG. 3a, a first part is a grey area whereas a second part is an area in layer L1 between two grey areas. In the right portion in layer L2 a first part is enclosed by a rectangle whereas a second part is not enclosed. One first and one second part together form one period. Preferably, a phase transition as shown in FIG. 3a is used, where the portions end with a first or second part, that has a size smaller than a regular first or second part, i.e., its size is only a quarter of the periodicity. So, when only two portions per layer are used, the parts of a portion that are adjacent to the other portion, are first or second parts that are only a quarter of the periodicity of the portion (i.e., is only half as big as ordinary first or second parts). Also other transitions may be used. When more than two portions per layer are used, the different transitions between the portions are preferably chosen equal for all transitions. However, different transitions may be chosen.

The last part may be an upper or a lower part of the block function. Of course, other phase transitions may be applied, but these will generate different patterns.

The generated Moiré pattern further depends on the resist that is used. Some resists enlarge the phase depth, while others reduce the phase depth.

If, for instance, the resist alignment mark 11, is shifted in the periodic direction with respect to the lower alignment mark 10, the position of the Moiré pattern will also shift (with a magnification factor $M_f$), but the direction of the shift will be opposite for adjacent portions. The arrows in FIG. 3b indicate a possible shift direction of the Moiré pattern. Of course, if the relative shift of the layers is opposite, the Moiré shifts of the different portions is also in the opposite directions.

Figure 3B:
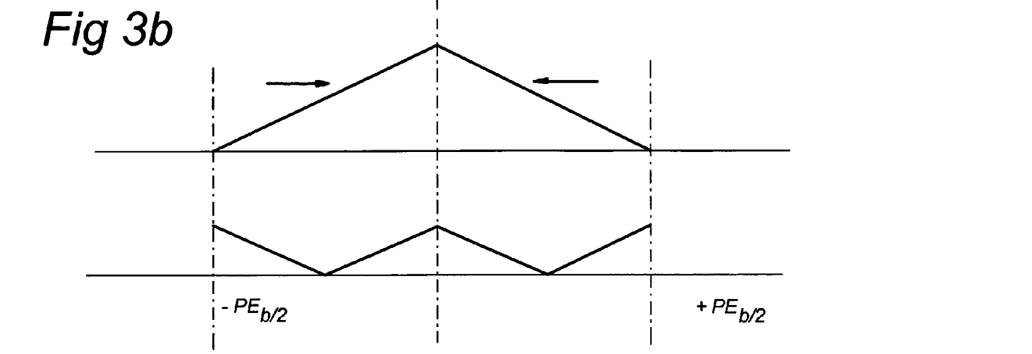

If the shift of the two alignment marks 10, 11 has a certain value, the position of the Moiré fringes may shift a distance of $PE_b/4$, as depicted in the lower part of FIG. 3b. The lower graph shown in FIG. 3b has a period that is only half the period of the graph shown in the upper part of FIG. 3b, i.e., $PE_2/2$. Of course, if the two alignment marks 10, 11 are shifted in the opposite direction, the combined Moiré patterns of the different portions may become a periodic signal having a period that is half the period of the original Moiré pattern. The periodicity of the combined Moiré pattern, i.e., the Moiré pattern of all the different portions, is a function of the relative position of the alignment marks 10, 11. Information about the overlay error can thus be derived by determining the periodicity of the combined Moiré pattern of the different portions provided in the alignment marks 10, 11.

Figure 3C:
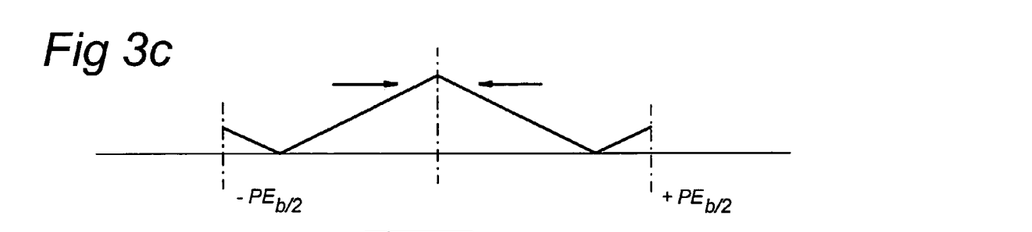

By way of illustration, FIG. 3c depicts an intermediate situation between the situations depicted in FIG. 3b.

The length of each portion preferably equals $PE_2/2$, so each portion contains approximately half a period of the Moiré pattern $PE_b$, as stated above. Only when this is the case, a combined Moiré pattern can be generated having a periodicity that equals $PE_2/2$. If the combined Moiré pattern is formed by adjacent portions having a length of $PE_2/2$, the periodicity of the combined Moiré pattern can vary between $PE_b$ to $PE_2/2$. However, it will be understood by a person skilled in the art that it is also possible to use portions having other lengths. A relative shift of the alignment marks 10, 11 may result in a change in the diffraction pattern from which the relative shift of the alignment marks 10, 11 may be deduced, regardless of the exact lay out of the alignment marks 10, 11. The embodiment described here is a preferred embodiment.

The periodicity of the combined Moiré pattern can be determined in many different ways, for instance, by registering the Moiré pattern with a linear photodiode or a one or two dimensional processing system/optics. The periodicity can then be derived by processing the measured data by, for instance, a computer or the like.

Figure 4:
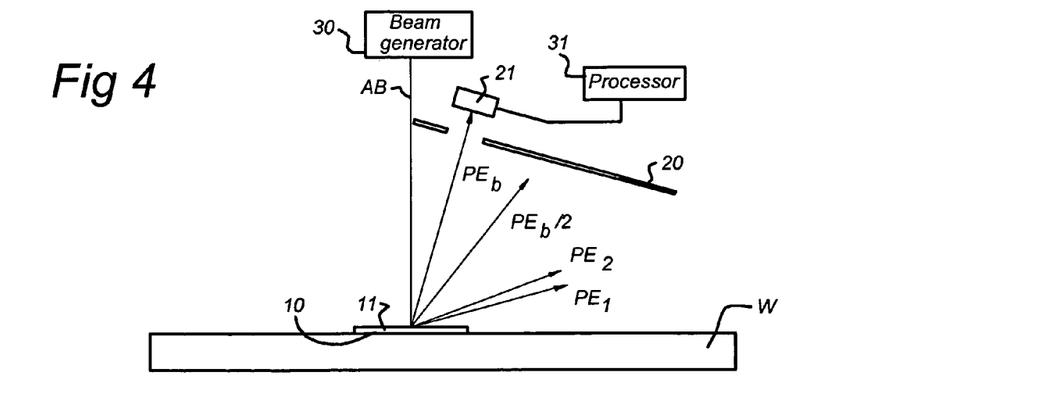
FIG. 4 schematically depicts a measurement system according to an embodiment of the present invention.

Alternatively, the periodicity may be determined using a diffraction pattern. Referring to FIG. 4, when an alignment beam AB is projected on the combination of fine alignment marks 10, 11, a diffraction pattern is generated, comprising information about the periodicity of the alignment marks 10, 11. The diffraction patterns comprise a plurality of light beams directed in different directions, where the direction of each light beam is determined by the periodicity of the alignment marks 10, 11. For instance, the individual alignment marks 10, 11 each comprise periodic signals having a periodicity of $PE_1$ and $PE_2$, which results in two separate diffraction lines, indicated by $PE_1$ and $PE_2$ in FIG. 4.

Also, the diffraction pattern shows the periodicity of the Moiré pattern. If the alignment marks 10, 11 are positioned with respect to each other according to the situation depicted in FIG. 3a and the top part of FIG. 3b, the periodicity of the combined Moiré pattern equals $PE_b$, represented by a diffraction line indicated by $PE_b$ in FIG. 4. However, if the alignment marks 10, 11 are shifted to a position corresponding to the lower part of FIG. 3b, the periodicity of the Moiré pattern becomes $PE_b/2$, so that diffraction line $PE_b$ will no longer be present in the diffraction pattern. Since the periodicity of the combined Moiré pattern now equals $PE_b/2$, a diffraction line will now be present representing that periodicity, indicated by $PE_b/2$ in FIG. 4. It can be seen that diffraction lines representing different periodicities have different directions. Of course, a similar diffraction pattern will be present on the left side of the alignment beam AB, but this part of the diffraction pattern is not shown in FIG. 4.

The embodiment depicted in FIG. 4 shows a plate 20 provided with a hole and a light detecting element, such as a photo diode 21. The hole of the plate 20 and the photo diode 21 are positioned in such a way that the photo diode 21 detects the diffraction line representing a periodicity of $PE_b$. The intensity of this diffraction line will have a maximum value in the situation depicted in the top part of FIG. 3b and will have a minimum, in the situation depicted in the lower part of FIG. 3b. The intensity measured by the photo diode 21 is thus a function of the relative position of the alignment marks 10, 11. FIG. 4 clearly depicts that the alignment beam (AB) is generated by a beam generator (30). The light detecting element (21) is connected to a unit (31), such as a processor, for determining the periodicity of the Moiré pattern, and determining the relative positions of the fine alignment marks (10, 11) in substantially the first directions based on the determined periodicity of the Moiré pattern.

The plate is used in order to filter out all other frequencies, for instance produced by surfaces of the surroundings. Such surfaces are usually relatively rough, having a broad spatial spectrum. The plate is used to keep these stray signals away from the photo diode 21, thus improving the signal-to-noise ratio of the system.

Figure 5A:
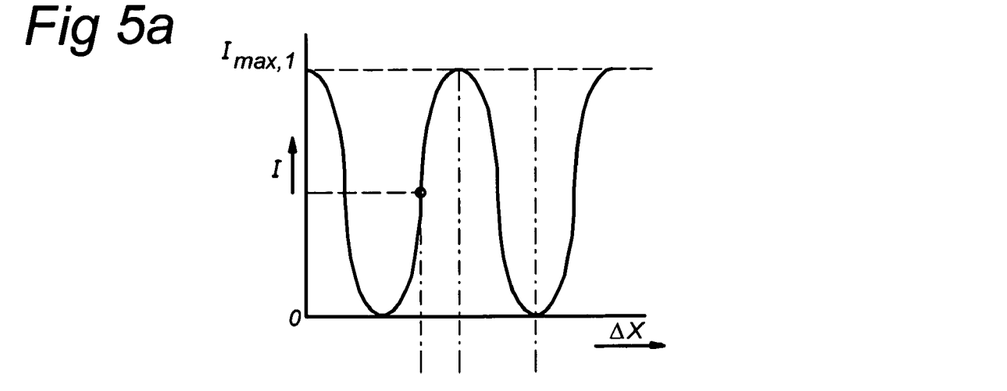
FIGS. 5a and 5b schematically depict the intensity of some diffraction lines as a function of the overlay error.

FIG. 5a shows the intensity of the diffraction line $PE_b$ as a function of the displacement of the two alignment marks 10, 11. The intensity varies between a maximum value $I_{max,1}$ and a minimum value equal or close to zero, and has a periodicity equal to substantially $PE_2/2$. With the use of the graph shown in FIG. 5a, it is possible to determine the overlay error between the alignment marks 10, 11 on the basis of measuring the intensity of the diffraction line representing the $PE_b$ periodicity.

Since the portions of the upper and lower layer $L_1$, $L_2$ are usually not perfectly aligned, the Moiré pattern is not perfectly periodic. This is a result of the fact that at the borders, portions with similar periodicity will be lying on top of each other. However, since the overlap is usually small (<100 nm) in comparison with the length of a portions, this will be of minor relevance for practical applications.

Figure 5B:
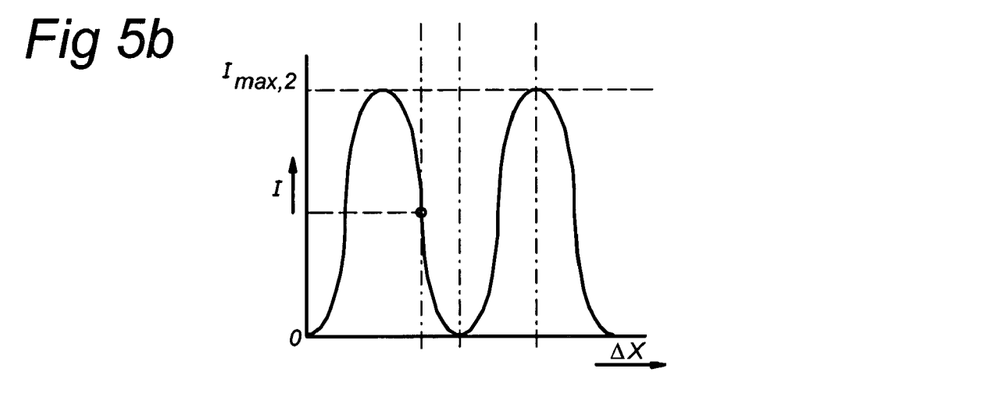

It will be understood that the same result can be achieved by measuring the intensity of the diffraction line representing a periodicity of $PE_2/2$. FIG. 5b shows the intensity of the diffraction line $PE_2/2$, which has a phase shift of 180° relative to the intensity of the diffraction line $PE_b$ shown in FIG. 5a.

The diffraction line $PE_2/2$ also varies between a maximum value $I_{max,2}$ and a minimum value, equal or close to zero.

It will be understood that both the diffraction lines of FIGS. 5a and 5b represent the same information about the relative positioning of the fine alignment marks 10, 11. Measuring the intensity of one of these diffraction lines gives information about the overlay error.

Figure 6:
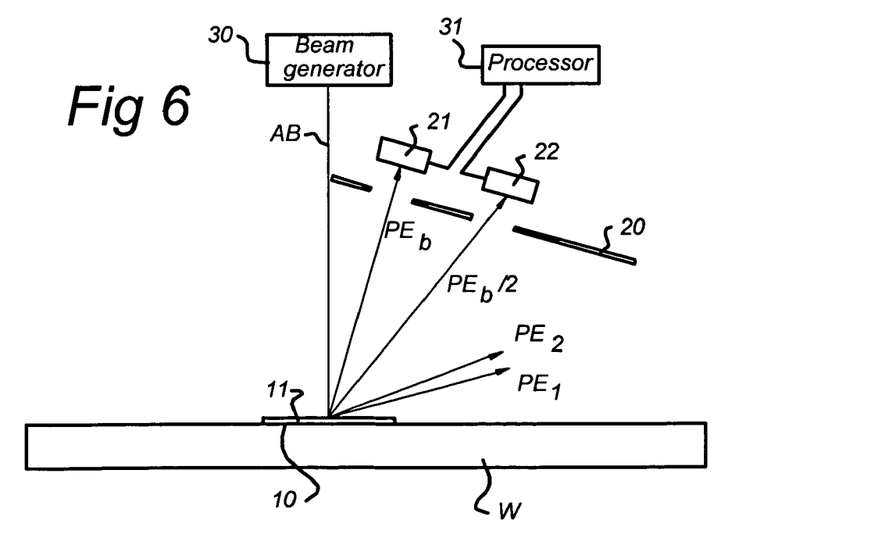
FIG. 6 schematically depicts a measurement system according to an further embodiment of the present invention.

However, in a further embodiment of the invention shown in FIG. 6, both the diffraction lines representing $PE_b$ and $PE_b/2$ are measured. This is done in order to achieve a more accurate measurement, as will be understood by a person skilled in the art. Of course, for the same reasons higher order diffraction lines, representing smaller periodicities can be measured.

If the desired relative position of the two alignment marks 10, 11 is as shown in FIG. 3a, it can be seen in FIGS. 5a and 5b that the diffraction line representing the $PE_b$ periodicity has a maximum, while the diffraction line representing the $PE_2/2$ periodicity has a minimum. So, if the intensity of, for instance, the diffraction line representing the $PE_b$ periodicity is measured and it is found that it differs from the desired value $I_{max,1}$, the overlay error can not unambiguously be determined, i.e., no distinction can be made between a shift to the right and a shift to the left. The sign of the overlay error is still unknown, and the desired correction that needs to be applied to, for instance the position of the mask MA, can not be determined.

Therefore, it is advantageous to give the two alignment marks 10, 11 an offset in their relative positioning. The desired relative positioning of the alignment marks 10, 11, for instance is exactly in between the situations depicted in the FIGS. 3a and 3b. In that case, the desired measured intensity of the different diffraction lines is approximately half the value of $I_{max1,2}$, as is indicated in FIGS. 5a and 5b by the dot. If an intensity I is measured that differs from the desired intensity, the overlay error is known together with the direction of the overlay error. Since one of the diffraction intensities will increase while the other will decrease, the direction of the shift can be determined from the actual intensity change of the respective diffraction lines and an appropriate adjustment can be made to, for instance, the position of the mask MA.

Since the function of the intensity of the diffraction lines is a periodic function of the overlay error, the overlay can be determined with accuracy if the overlay error remains relatively small in comparison with the periodicity of the intensity of the diffraction lines. In case the desired position of the overlay marks 10, 11 corresponds to the positions indicated by the dots in FIGS. 5a and 5b, the overlay error should be smaller than a fourth of the periodicity of the intensity of the diffraction lines as a function of the overlay error. This means that the coarse alignment of the alignment marks 10, 11 should at least be accurate within a quarter of the period of the alignment marks 10, 11, i.e., $PE_1/4$ and $PE_2/4$. Persons skilled in the art may note that such coarse alignment can easily be achieved with lithographic projection machines from the prior art. Therefore, this requirement can be easily satisfied.

The method of determining the overlay error between two alignment marks as described above only provides information about the overlay error in one direction, i.e., in the direction of the periodicity. However, it will be understood that also the overlay error in a second direction, preferably perpendicular to the first direction, needs to be determined. Therefore, other alignment marks may be provided with a periodic structure, perpendicular to the original alignment marks 10, 11. In order to further reduce the overlay error, the overlay error in a single direction may be determined more than once with the use of different alignment marks 10, 11, preferably positioned as far away from each other as possible on the surface of the substrate W.

As already stated above, different types of alignment marks 10, 11 can be used, such as an amplitude mark and/or a phase mark can be used. The alignment mark can also be a latent mark, i.e., an image of an alignment mark in a resist that has not yet been developed. If use is made of a latent alignment mark, a novel alignment strategy can be implemented, including positioning a substrate W provided with a substrate alignment mark 10 under the projection lens system; imaging a resist alignment mark 11 on top of the substrate alignment mark 10; projecting an alignment beam AB to the fine alignment marks 10, 11, the resist alignment mark still being a latent mark; determining the relative position of the two fine alignment marks 10, 11, according to the method described above; adjusting the relative positioning of the mask MA with respect to the substrate W based on the determined relative position of the two fine alignment marks 10, 11; and imaging the patterned beam PB to the substrate W.

Instead of adjusting the relative positioning of the mask MA with respect to the substrate W, adjustments to the projection system PL may be made, which have the effect of moving the image of the mask MA to compensate for the relative position of the two fine alignment marks.

In cases that the use of latent marks is not possible, the resist alignment mark 11 may be processed (developed) first, in order to be made visible. The method would then include positioning a substrate W provided with a substrate alignment mark 10 under the projection lens system; imaging a resist alignment mark 11 on top of the substrate alignment mark 10 together with a circuit pattern; processing the resist alignment mark in order to make it visible; projecting an alignment beam AB to the fine alignment marks 10, 11, and determining the relative position of the two fine alignment marks 10, 11, according to the method described above.

If the alignment error determined exceeds a certain threshold, the resist is removed, and a new resist layer is applied to the substrate. For a second or subsequent exposure, adjustments can be made in order to reduce the overlay error, for instance by offsetting the position of the substrate W and/or the mask MA or by making adjustments to the projection system PL as described above in the alignment strategy for the latent alignment mark. The substrate W is exposed a second or subsequent time, until the alignment error is below a certain threshold. The value of the threshold can be chosen by the user and is, for instance, dependent on the typical dimensions of the circuit pattern.

It will be understood by a person skilled in the art that the use of non latent alignment marks may be more time consuming than the use of latent alignment marks, since an intermediate processing step may be used for which the substrate W is moved to a processing station. Moreover, this method may add more processing time, if the overlay check after the circuit pattern has been imaged onto the wafer shows the criterion is not met. For a latent image, processing time is saved because the overlay check is performed before the circuit pattern is imaged. In order to generate a Moiré pattern, an alignment beam AB is projected on the fine alignment marks 10, 11. The alignment beam AB can be monochromatic light. If white light is used, or light comprising certain specific spectral lines, more than one diffraction line is generated. Using non-monochromatic light may, however, increase the complexity of the measuring equipment required. For instance, additional filters and/or other apertures may be needed.

If the diffraction lines are projected to a focal point or line through use of, for instance, a lens, the alignment beam should be coherent, as will be understood by a person skilled in the art.

Next, the substrate is moved out of the lithographic projection apparatus 1 to be chemically processed and a new layer of resist is added to the substrate W. Subsequently, the substrate W is transported into the lithographic projection apparatus 1 in order to image a next circuit pattern to the substrate W. In order to do this, the alignment procedure, as described above, may be applied again. However, it is not possible to use the resist alignment mark 11 of the previous alignment procedure as a new substrate alignment mark for this new alignment procedure, since this alignment procedure would then be disturbed by the substrate alignment mark 10 of the previous alignment procedure. Therefore, more than one, preferably three positions on the substrate W are assigned as positions for alignment marks. The positions may include a substrate alignment mark, a resist alignment mark and an opaque layer formed in succession. After the opaque layer, a substrate alignment mark 10 may be formed again, etc.

If these cycles are applied to, for instance, three different alignment positions in such a way that for every new exposure in at least one alignment position a resist alignment mark comes round again, alignment according to invention is possible for every consecutive exposure.

Other embodiments, uses and advantages of the invention will be apparent to those skilled in the art from consideration of the specification and practice of the invention disclosed herein. The specification should be considered exemplary only, and the scope of the invention is accordingly intended to be limited only by the following claims.

The invention claimed is:

1. A method of measuring relative positions of a first alignment mark and a second alignment mark located on a substrate and oriented in a first direction that is substantially parallel to a surface of the substrate, the first alignment mark includes a periodic structure that is oriented substantially in the first direction having a first portion with a first periodicity and an adjacent second portion with a second periodicity, the second alignment mark including a periodic structure that is oriented substantially in the first direction having a first portion with the second periodicity and an adjacent second portion with the first periodicity, the first and second alignment marks being arranged such that the first portion of the first alignment mark and the first portion of the second alignment mark are substantially located one over the other, and the second portion of the first alignment mark and the second portion of the second alignment mark are substantially located one over the other, the method comprising:

directing an alignment beam to the first and second alignment marks;

measuring a Moiré pattern generated by interference between respective first portions of the first and second alignment marks, and interference between respective second portions of the first and second alignment marks; and determining the relative positions of the first and second alignment marks based on the measured Moiré pattern.

2. The method according to claim 1, wherein the first and second portions of the first alignment mark and the second alignment mark have a length of substantially $PE_2/2$, where PEb is given by:

$1/PE_b = 1/PE_1 - 1/PE_2$, where $PE_1$ is the first periodicity and $PE_2$ is the second periodicity.

3. The method according to claim 1, wherein the first alignment mark and the second alignment mark are provided in different layers on the substrate.

4. The method according to claim 1, wherein the second alignment mark is a latent alignment mark.

5. The method according to claim 1, wherein the second alignment mark is a developed alignment mark.

6. The method according to claim 1, wherein measuring the Moiré pattern comprises determining a periodicity of the Moiré pattern by making a spatial map showing an intensity of the Moiré pattern.

7. The method according to claim 6, wherein measuring the Moiré pattern comprises determining the intensity of the Moiré pattern at least at one position along an intensity curve.

8. The method according to claim 7, wherein the at least one position is adjacent to the second alignment mark and corresponds to a phase transition from the first portion to the second portion of the second alignment mark located within a layer on the substrate.

9. The method according to claim 7, wherein the at least one position is adjacent to the second alignment mark and corresponds to a phase transition with an offset of $PE_b/4$.

10. The method according to claim 1, wherein measuring the Moiré pattern comprises determining a periodicity of the Moiré pattern by measuring an intensity of at least one diffraction line of a diffraction pattern generated from the first alignment mark and the second alignment mark.

11. The method according to claim 10, wherein said at least one diffraction line corresponds to the periodicity of the Moiré pattern ($PE_b$).

12. The method according to claim 10, wherein at least one diffraction line corresponds to half the periodicity of the Moiré pattern ($PE_2/2$).

13. The method according to claim 1, wherein the first periodicity and the second periodicity are each formed by a block function, comprising alternating first portions and second portions, and each of the first and second portions ends at one end of the block function oriented in the first direction with a length of one or three quarters of the corresponding first periodicity and second periodicity.

14. A substrate having two nr more layers, comprising:
   a first alignment mark positioned on a first layer of the substrate having a first periodic structure that is oriented substantially in a first direction, the first periodic structure including a first portion with a first periodicity and an adjacent second portion with a second periodicity;
   a second alignment mark positioned on a second layer of the substrate that is adjacent to the first layer, the second alignment mark having a second periodic structure that is oriented substantially in the first direction, the second periodic structure including a first portion with the second periodicity and an adjacent second portion with the first periodicity; and
   the first and second alignment marks being arranged such that the first portion of the first alignment mark and the first portion of the second alignment mark are substantially located one over the other, and the second portion of the first alignment mark and the second portion of the second alignment mark are substantially located one over the other, such that respective first portions of the first and second alignment marks provide Moiré interference patterns, and respective second portions of first and second alignment marks provide Moiré interference patterns.

15. An alignment apparatus for determining relative positions of a first alignment mark and a second alignment mark that are oriented in a first direction substantially along the surface of a substrate, the alignment apparatus including a substrate holder for holding the substrate, wherein the first alignment mark is positioned on a first layer of the substrate having a first periodic structure that is oriented substantially in the first direction, the first periodic structure including a first portion with a first periodicity and an adjacent second portion with a second periodicity, the second alignment mark positioned on a second layer of the substrate that is adjacent to the first layer, the second alignment mark having a second periodic structure that is oriented substantially in the first direction, the second periodic structure including a first portion with the second periodicity and an adjacent second portion with the first periodicity, the first and second alignment marks being arranged such that the first portion of the first alignment mark and the first portion of the second alignment mark are substantially located one over the other, and the second portion of the first alignment mark and the second portion of the second alignment mark are substantially located one over the other, the apparatus comprises:
   a beam generator constructed and arranged to direct an alignment beam to the first and second alignment marks;
   a light detector constructed and arranged to detect a Moiré pattern generated by interference between respective first portions of the first and second alignment marks, and interference between respective second portions of the first and second alignment marks;
   a first unit constructed and arranged to determine the periodicity of the Moiré pattern; and
   a second unit constructed and arranged to determine the relative positions of the first and the second alignment marks based on the determined periodicity of the Moiré pattern.

16. A lithographic projection apparatus comprising:
   a radiation system constructed and arranged to provide a projection beam of radiation;
   a support structure constructed and arranged to support a patterning means, the patterning means serving to pattern the projection beam according to a desired pattern;
   a substrate table constructed and arranged to hold a substrate; and
   a projection system constructed and arranged to project the patterned beam onto a target portion of the substrate, the substrate including a first alignment mark positioned on a first layer of the substrate having a first periodic structure that is oriented substantially in a first direction, the first periodic structure including a first portion with a first periodicity and an adjacent second portion with a second periodicity, a second alignment mark positioned on a second layer of the substrate that is adjacent to the first layer, the second alignment mark having a second periodic structure that is oriented substantially in the first direction, the second periodic structure including a first portion with the second periodicity and an adjacent second portion with the first periodicity, and
   the first and second alignment marks being arranged such that the first portion of the first alignment mark and the first portion of the second alignment mark are substantially located one over the other, and the second portion of the first alignment mark and the second portion of the second alignment mark are substantially located one over the other, such that respective first portions of the first and second alignment marks provide Moiré interference patterns, and respective second portions of first and second alignment marks provide Moiré interference patterns.

17. The lithographic projection apparatus according to claim 16, further comprising an error determination unit that determines a first relative position between the first alignment mark and the second alignment mark to provide an indication of whether an alignment error is present between the first alignment mark and the second alignment mark.

* * * * *